United States Patent
Dronhofer et al.

(10) Patent No.: US 11,367,599 B2
(45) Date of Patent: Jun. 21, 2022

(54) TUBULAR TARGET

(71) Applicant: PLANSEE SE, Reutte (AT)

(72) Inventors: Andre Dronhofer, Reutte (AT); Christian Linke, Reutte (AT); Elisabeth Eidenberger-Schober, Breitenwang (AT)

(73) Assignee: Plansee SE, Reutte (AT)

( * ) Notice: Subject to any disclaimer, the term of this patent is extended or adjusted under 35 U.S.C. 154(b) by 659 days.

(21) Appl. No.: 15/571,600

(22) PCT Filed: Apr. 28, 2016

(86) PCT No.: PCT/AT2016/000044
§ 371 (c)(1),
(2) Date: Nov. 3, 2017

(87) PCT Pub. No.: WO2016/176696
PCT Pub. Date: Nov. 10, 2016

(65) Prior Publication Data
US 2018/0144913 A1    May 24, 2018

(30) Foreign Application Priority Data
May 6, 2015 (AT) .................. GM108/2015

(51) Int. Cl.
*H01J 37/34* (2006.01)
(52) U.S. Cl.
CPC ...... *H01J 37/3435* (2013.01); *H01J 37/3408* (2013.01); *H01J 37/3429* (2013.01); *H01J 37/3488* (2013.01)

(58) Field of Classification Search
CPC .................................................. H01J 37/3435
(Continued)

(56) References Cited

U.S. PATENT DOCUMENTS 5,904,966 A * 5/1999 Lippens .................. B22F 7/06
204/298.12
6,645,358 B2   11/2003 Lupton et al.
(Continued)

FOREIGN PATENT DOCUMENTS

DE    102004058316 A1   6/2006
DE    102013103472 A1   10/2014
(Continued)

OTHER PUBLICATIONS

Translation to Heinrich (DE 10 2013 103 472) published Oct. 2014 (Year: 2014).*
(Continued)

*Primary Examiner* — John J Brayton
(74) *Attorney, Agent, or Firm* — Laurence A. Greenberg; Werner H. Stemer; Ralph E. Locher

(57) ABSTRACT

A target for a cathode sputtering system has a tubular target body made of a sputtering material and at least one connector piece, which is connected to the target body and projects from the target body, for attaching the target body to the cathode sputtering system. The target body is connected to the at least one connector piece in a vacuum-tight manner and the two are rotationally fixed relative to one another. At least one damper element is provided between the at least one connector piece and the target body.

10 Claims, 3 Drawing Sheets

(58) Field of Classification Search
USPC .................................. 204/298.21, 298.22
See application file for complete search history.

(56) References Cited

U.S. PATENT DOCUMENTS

| | | | |
|---|---|---|---|
| 6,787,011 B2* | 9/2004 | Ueda | ........................ C23C 14/10 |
| | | | 204/192.1 |
| 2003/0136662 A1 | 7/2003 | Ueda et al. | |
| 2006/0151320 A1* | 7/2006 | Weigert | .............. C23C 14/3407 |
| | | | 204/298.12 |
| 2007/0007129 A1 | 1/2007 | De Bosscher | |
| 2007/0029192 A1 | 2/2007 | Schuhmacher et al. | |
| 2015/0090587 A1 | 4/2015 | Gartner et al. | |
| 2015/0221485 A1 | 8/2015 | Mutschlechner et al. | |

FOREIGN PATENT DOCUMENTS

| | | |
|---|---|---|
| EP | 1225249 A1 | 7/2002 |
| EP | 1666631 A2 | 6/2006 |
| EP | 1752556 A1 | 2/2007 |
| JP | 2002155356 A | 5/2002 |
| JP | 2015505901 A | 2/2015 |
| WO | 2014040100 A1 | 3/2014 |

OTHER PUBLICATIONS

Jan Dolkemeyer, "Aufbau- und Löttechniken für die Montage von Festkörperlasern" [Assembling and soldering technics for the manufacturing of solid state lasers] Dissertation Oct. 7, 2011, RWTH AAchen University—English abstract.

* cited by examiner

TUBULAR TARGET

BACKGROUND OF THE INVENTION

Field of the Invention

The invention relates to a target for a cathode sputtering installation, having a tubular target body.

A target here is to be understood to be a sputtering source for a cathode sputtering installation. In cathode sputtering a target material is "sputtered" by means of plasma and is deposited as a thin layer on a substrate. Cathode sputtering is usually also referred to as sputtering, and the sputtering sources are usually referred to as sputtering targets. A target having a tubular target body is thus a sputtering target in tubular form, and is also referred to as a tube target. A sputtering method which is employed particularly often is magnetron sputtering. While only an electric field is applied during simple cathode sputtering, a magnetic field is additionally generated in magnetron sputtering. On account of the electric field and the magnetic field being superimposed, the path of the charge carriers is extended and the number of impulses per electron is increased. The magnetic field is usually generated by one magnet or by an assembly of a plurality of magnets which is incorporated in the interior of the tube target.

An advantage of tubular targets (tube targets) lies in the more uniform removal and thus the higher degree of utilization in comparison with planar targets. Degree of utilization is understood to be the sputter material mass at the end of the total employment time of the target in relation to the mass of the target prior to the first employment thereof. In this manner, the degree of utilization for planar targets is approx. 15 to 30%, and is typically 70 to 90% for tube targets.

Cooling of the target, which is implemented in the internal space of a tube target, on account of the more favourable heat transfer in a tubular target, is significantly more effective than in planar targets, enabling higher energy densities on the surface and thus higher coating rates. Moreover, the tendency towards localized arcing is reduced in particular in the case of reactive sputtering. The employment of tube targets is particularly advantageous when substrates having a large area are coated. During employment the tube target is rotated at a slow speed while the magnetic field is usually stationary.

EP 1 225 249 B1 discloses a tubular target for cathode sputtering installations. In each case one support tube or a connector tube, respectively, is disposed at the ends of a tubular target body. The target is installed in an installation by means of the support tubes which protrude from the target body. In one design embodiment a support tube is push-fitted into an open end of the target body and is subsequently secured by means of a screw which is screwed through a flange of the support tube into an end-face edge of the target body. Alternatively, an external thread for a union nut by means of which a flange of the support tube may be press-fitted to the end face of the target body is provided on the target body.

DE 10 2004 058 316 A1 discloses a tubular sputtering target having a target body and a fastening device which is disposed on at least one tube end, wherein the fastening device and/or a tube end cap are/is connected to the target body in a materially integral or form-fitting manner.

WO 201440100 A1 discloses a target for a cathode sputtering installation, having a tubular target body from a sputtering material, and two connector pieces, which are fastenable to the target body, for connecting the target body to a cathode sputtering installation, wherein a first connector piece is connectable to a first end of the target body, and a second connector piece is connectable to a second end of the target body, and wherein at least one locking means is configured on each connector piece so as to connect the respective connector piece to the target body in a manner secured against twisting.

It is known for tube targets to be able to be made as monolithic targets. Monolithic targets usually do not have a continuous support tube. Monolithic targets enable a material yield of up to 80% and are substantially less sensitive to temperature, on account of which particularly high energy densities up to 30 kW/m are possible during sputtering. In this way, maximum deposition rates and a higher production rate are possible, on account of which the properties of the deposited layers may be improved. For example, the layers generated inter alia have higher electrical conductivity.

The monolithic embodiment of tube targets is particularly advantageous in the case of metallic targets, provided that the sputtering material used has sufficient mechanical strength, ductility, and fracture toughness. The mechanical parameters and the geometric layout of the end region are particularly critical in the employment of monolithic targets, since very thin wall thicknesses (preferably less than 4 mm) have to be implemented here in some instances. This is usually performed by machining the target body. In the case of damage to one or both of the end regions of a monolithic target, the entire target may, in the worst scenario, not be able to be employed and may have to be remade again.

Connector pieces such as disclosed in EP 1 225 249 B1, for example, are an alternative to machining the end region(s) of the target body.

Furthermore, bonded targets are known as an alternative to monolithic targets. Here the target body is attached to a support tube by way of soldering/brazing or bonding, respectively, a solder melting at a low temperature usually being used here. On account thereof, such targets are more sensitive to temperature and (partial) melting of the solder (which is usually indium solder melting at a low temperature) and peeling of the target body from the support tube may arise when high energy densities are incorporated and thus when high temperatures are generated.

A tube target is usually rotated about the longitudinal axis thereof during the sputtering procedure. Typical rotation speeds are between 5 and 10 revolutions per minute. The employment time of such a target is usually a few weeks to a few months such that a plurality of 10,000 to 100,000 revolutions may be performed.

Overall, there is thus cyclical thermo-mechanical stress which must be considered in particular in the case of the connection points between the individual components of a tube target. It is also important here that tight tolerances are adhered to for true running of the individual components of a tube target, since increased mechanical stress may otherwise arise in the connection zone. The end region(s) of a tube target may then be in direct contact with further installation parts of the cathode sputtering installation, or may be connected thereto. They may be in contact with or connected to a so-called end block or to in each case one end block at either end of the target, respectively, said end block transmitting rotation and electrical power to the target.

When using materials in which the respective coefficients of linear thermal expansion greatly differ for the components of a tube target, mechanical tensions or deformations may arise under certain circumstances when bonded tube targets or monolithic tube targets having attached connector pieces are employed, said tensions or deformations potentially leading to a loss of mechanical stability or vacuum tightness of the tube target.

On account of the rotation of the target and of the cyclical thermal stress on the target surface, various mechanical stresses arise in the target which may have an effect in the connection zone of the individual components of the tube target in particular in the case of monolithic targets having attached connector pieces. Loss of vacuum tightness due to failure of the material-integral or form-fitting connection between the target body and the connector pieces may be a further consequence.

The connection points are particularly susceptible to crack formation and as a further consequence to total target failure, for example due to leaking coolant, in particular when brittle materials are used for the components of a tube target.

SUMMARY OF THE INVENTION

It is thus an object of the invention to provide an improved tubular target having an extended service life and a reduced tendency towards crack formation or towards fracturing of the target, respectively.

This object is achieved by the features as claimed. Advantageous design embodiments are the subject matter of the dependent claims.

A tube target for cathode sputtering installations, for example for magnetron sputtering installations, is provided. The tube target has a tubular target body from a sputtering material, and at least one connector piece (flange), which is connected to the target body and protrudes from the target body, for connecting the target body to a cathode sputtering installation.

For example, a first connector piece is connected to a first end of the target body, and a second connector piece is connected to a second end of the target body. The ends are considered to be the end-face side regions of the target body. The ends of the target may be designed so as to be dissimilar, for example, wherein at least one end of the target is configured as will be described hereunder. Alternatively, both ends of the target may be constructed in a symmetrical manner such that the connector piece (and the further elements which will be described hereunder) on a first end of the target corresponds to the connector piece (and to the further elements) on the opposite second end of the target.

The target body is connected to the at least one connector piece in a vacuum-tight manner and so as to be secured against twisting, and furthermore has at least one damping element which is disposed between the at least one connector piece and the target body.

The connector piece and the target body are thus interconnected in a vacuum-tight manner and so as to be secured against twisting. This connection is preferably not releasable and/or is implemented in a materially integral manner, for example by means of soldering/brazing, adhesive bonding, welding or a combination of the previously mentioned methods with further materially non-integral methods such as screwing, for example, that is to say by means of screwing and adhesive bonding, for example. In particular, a seal or a sealing material, such as an O-ring, for example, may be additionally disposed between the target body and the connector piece, so as to provide a vacuum-tight connection in a simple manner.

The at least one connector piece is preferably connected to the target body in a materially integral manner, for example by means of soldering/brazing, adhesive bonding or a combination of screwing and adhesive bonding or soldering/brazing. Particularly preferably, the at least one connector piece is connected to the target body by means of adhesive bonding.

The tubular target or the tube target, respectively, by means of the connector piece or of the connector pieces, respectively, may be installed both vertically as well as horizontally in a cathode sputtering installation. Whether the tube target is installed in a vertical or horizontal position, and on whether one connector piece or both connector pieces of the tube target are fastened to the installation here depends on the embodiment of the cathode sputtering installation.

An electrical output is applied to a tube target in the operational state, which output may be up to a few hundred kilowatts. The voltages of up to a few hundred volts and the electrical currents of a plurality of amperes required therefore have to be transmitted to the target body via the at least one connector piece.

Therefore, the connection between the connector piece and the target body should ideally have some electrical conductivity or low electrical resistance, respectively. The connection should furthermore have sufficient mechanical strength and ductility.

The target according to the invention has at least one damping element which is disposed between the at least one connector piece and the target body. The at least one damping element is preferably disposed between the target body and the at least one connector piece such that said damping element is connected to each at least one face of the target body and to at least one face of the at least one connector piece. The damping effect of the damping element is optimally guaranteed in this way, since the tensions which are applied to the target on account of the rotational stress during the operation of the target may be distributed in an optimal and uniform manner in the connection zone between the target body and the connector piece. The size of the region in which the damping element is disposed and is effective has to be adapted to the respective geometrical embodiments of the target body and of the at least one connector piece, as well as to the processing conditions at which the target is employed.

In one preferred embodiment a solder or an adhesive is disposed between the target body and the at least one damping element, and/or between the at least one connector piece and the at least one damping element. The cohesion and vacuum tightness of the target is further improved by the solder or the adhesive, and the effect of the damping element is additionally optimized. In this way, a form-fitting connection by way of adhesives or solders between the target body and the damping element, or between the connector piece and the damping element, respectively, may at least in part be combined with a materially integral connection such that the target may be employed so as to be even more stable and more operationally reliable under the usual employment conditions.

The adhesives or solders employed for connecting the connector pieces under usual employment conditions have high strength and low elongation. In relation to the employed sputtering materials (target body) and the materials for the at least one connector piece, the adhesives and solders typically display a significantly lower capability of plastic deformation. The resistance to crack formation on account of mechanical and/or thermo-mechanical stress is low.

Depending on the choice of the solders or adhesives employed in each case, a large bandwidth of mechanical, thermal, and electrical properties and combinations of properties is possible. In this way, the tensile strength of typical solders may readily be more than 50 MPa. Elongation figures up to 20% are likewise possible. The basic data pertaining to various solders may be found in "*J. Dolkemeyer: "Aufbau- und Löttechniken für die Montage von Festkörperlasern", Dissertation RWTH Aachen, Okt. 2011*" (J. Dolkemeyer: "Construction and soldering/brazing techniques for the assembly of solid state lasers", Graduate thesis RWTH Aachen, October 2011").

There is also a large variety of properties in the case of adhesives. However, typical epoxy resins tend to have lower tensile strength or tensile shear strength, respectively, and lower elongation figures as compared to solders.

In order for the adhesion of the solder or of the adhesive to be guaranteed in an optimal manner, pre-treatment of the faces of the target body, of the connector piece, or of the damping element, respectively, that are in direct contact with the solder or with the adhesive may be provided. Such pre-treatment may be performed by way of blasting with sand, metal balls or similar shot-blasting media, leading to a modified surface having specific roughness or to an optimized stress condition. It may furthermore be necessary for the respective faces to be made available in a cleaned and grease-free state. The thickness of the at least one damping element in the radial direction is preferably between 0.25 and 5 mm.

In the case of thicknesses of less than 0.25 mm it may be that the damping effect is already no longer available in an optimal manner since the rigidity of the damping element has already been structurally reduced. In the case of thicknesses of less than 0.25 mm reliable handling and positioning of the damping element in the process is no longer guaranteed in an optimal manner. In turn, thicknesses of more than 5 mm may already lead to positioning of the individual components (the connector piece, the target body, the damping element) being impeded above all in embodiments which additionally contain solder or adhesive. The axial position of the damping element in relation to the target body is preferably close to those regions of the target body that display the highest wear in terms of material (material removal in the radial direction of the target body). A thickness of the damping element in excess of 5 mm may already lead to the maximum utilization of the target being compromised and to a reduced service life of the target, since the usable material thickness of the target body is reduced in the region in which the damping element is located.

The target body in a target according to the invention is (completely) manufactured from the sputtering material or from the coating material, respectively; that is to say that a so-called monolithic target is provided.

The sputtering materials used are preferably metallic. In one preferred embodiment of the target the target body is composed of a material from the following group: molybdenum, a molybdenum-based alloy, titanium, a titanium-based alloy, copper, a copper alloy. The target body furthermore preferably is composed of molybdenum or of a molybdenum alloy.

The at least one connector piece may be made from the same or from a similar material as the target body, or from another metallic material. Similar here is to be understood that at least 80% of the elements of which the target body or the connector piece(s), respectively, is/are composed are the same (for example in the case of an alloy).

Preferred combinations for the combination of target-body materials and connector-piece materials are listed in an exemplary manner in Table 1, wherein base is to be understood that more than 50% by atomic weight of the respective element is contained in the material.

TABLE 1

Preferred material combinations for a target body/target bodies and for a connector piece/connector pieces of a tube target

| Target body | Connector piece | | | |
| --- | --- | --- | --- | --- |
| | Mo base | Cu base | Ti base | Stainless steel |
| Mo base | x | | x | x |
| Cu base | | x | | |
| Ti base | | | x | |

There may be a disadvantageous effect on the connection between the connector piece and the target body in particular when the difference in terms of the coefficient of thermal expansion between the materials used is too large. This arises in particular when the connector piece is made from another material than the target body. For example, the coefficient of linear thermal expansion (CTE) of molybdenum at room temperature is $5.2 \cdot 10^{-6}$ m/mK and that of stainless steel is approx. $16 \cdot 10^{-6}$ m/mK. In the case of excessive differences in CTE, tensile tensions arise in the connection zone after cooling, potentially leading to crack formation or to damage to the connection. Such damage may arise both during manufacturing of a tube target as well as during employment thereof. As a consequence, this in turn may lead to loss of vacuum tightness or to loss of mechanical integrity of the target.

The three-dimensional shape of the at least one damping element is preferably one of the following shapes:
tube
foil
mesh
net
spring
wire
rods
ring(s).

The at least one damping element is preferably composed of a metallic material.

The at least one damping element preferably has a coefficient of thermal expansion that is adapted to the other components of the target. Guide values for CTE and for thermal conductivity (WLF) and electrical conductivity of suitable materials for the target body as well as for the damping elements are listed in Table 2.

TABLE 2

| | Target body | | | | | Damping element | |
|---|---|---|---|---|---|---|---|
| | Mo | Cu | Ti | Ni | Fe | 1.3505 (100Cr6) | 1.4301 (x10CrNi18-8) |
| CTE, 0-100° C. ($1 \cdot 10^{-6}$ K$^{-1}$) | 5.2 | 16.6 | 8.6 | 13 | 11.3 | 12 | 16 |
| WLF, 20° C. (W/mK) | 140 | 400 | 22 | 91 | 80 | 43 | 15 |
| Electrical conductivity ($10^6$ $\Omega^{-1} \cdot$ m$^{-1}$) | 18 | 60 | 2.5 | 14 | 10 | 5 | 1.4 |

It is preferable for the coefficient of thermal expansion of the damping element to lie between the coefficient of thermal expansion of the target body and the at least one connector piece. Particularly preferable combinations of the coefficient of thermal expansion of the individual components of the tubular target according to the invention are:

$|CTE_{connector\ piece} - CTE_{target\ body}| < 10$
$|CTE_{connector\ piece} - CTE_{damping\ element}| < 10$
$|CTE_{target\ body} - CTE_{damping\ element}| < 10$ It is furthermore preferable for the thermal conductivity of the damping element to be equal to or greater than 15 W/mK, furthermore preferably to be equal to or greater than 40 W/m K, particularly preferably to be equal to or greater than 75 W/m k.

The electrical conductivity of the damping element is preferably equal to or greater than $1 \cdot 10^6$ $\Omega^{-1} \cdot$m$^{-1}$, furthermore preferably equal to or greater than $5 \cdot 10^6$ $\Omega^{-1} \cdot$m$^{-1}$, even furthermore preferably equal to or greater than $1 \cdot 10^7$ $\Omega^{-1} \cdot$m$^{-1}$.

In one embodiment of the invention the connector piece and the damping element are disposed so as to be axially adjacent. Such an arrangement has the advantage that a form-fitting connection between the connector piece and the damping element by means of screwing is readily implementable, or that only a small face has to be treated for a materially integral connection, respectively, this being additionally advantageous with a view to vacuum tightness. This arrangement has the advantage that no additional transverse stresses arise between the connector piece and the damping element during thermal stress in the event of a large difference between the CTE of the connector piece and of the damping element being present.

In one alternative embodiment of the invention the at least one damping element is disposed so as to be radially adjacent to at least one portion of the at least one connector piece. Such an arrangement has the advantage that transverse stresses that arise in the connection zone on account of the larger connection face between the damping element and the connector piece that is present in this embodiment may be reduced. Moreover, good capability for centring the connector piece in relation to the damping element is provided. It is also advantageous in this arrangement that flexural stresses which arise are not effective directly in the connection zone between the connector piece and the damping element such as would be the case in an axial arrangement, for example.

The at least one damping element may be connected to the connector piece by means of a screw connection, for example.

In the case of a screw connection between the axially connected connector piece and the damping element (cf. FIG. 1), the ends of the connector piece and of the damping element which bear on one another at the end faces may be screw-fittable to one another, for example, or the end-face side ends have corresponding internal/external threads, respectively, as is also shown in the enlargement in FIG. 1.

In the case of a screw connection between the radially disposed connector piece and the damping element (cf. FIGS. 2-1, 2-2, 3, 4-1, and 4-2) corresponding external threads or internal threads, respectively, may be likewise provided. For example, the damping element may have an internal thread, and the connector piece may have a corresponding external thread. Alternatively, the damping element may also have an external thread, and the connector piece may have a corresponding internal thread.

Alternatively or else additionally to the screw connection, the at least one damping element may be connected to the connector piece by means of a soldered/brazed connection or an adhesive connection.

BRIEF DESCRIPTION OF THE SEVERAL VIEWS OF THE DRAWING

Exemplary embodiments of the invention will be discussed in more detail by means of the figures in which:

FIG. 2-1 shows a schematic illustration of an end of a tube target in a sectional side view, according to a second design embodiment, wherein a damping element (4b) is disposed radially adjacent to a portion of the connector piece (6b);

FIG. 2-2 shows a schematic illustration of an end of a tube target in a sectional side view, according to a further design embodiment, wherein a damping element (4b') is disposed radially adjacent to a portion of the connector piece (6b); the axially inboard end region of the damping element (4b') in this embodiment extends radially across at least a part-region of the connector piece (6b);

FIG. 4-1 shows a schematic illustration of an end of a tube target in a sectional side view, according to a further design embodiment, wherein a damping element (4 d) is disposed radially adjacent to a portion of the connector piece (6 d); in this case the damping element is at least in part disposed on a radially inboard face of the connector piece (6 d), and only the axially inboard end region of the damping element is disposed between the connector piece (6 d) and the target body (2 d);

FIG. 4-2 shows a schematic illustration of an end of a tube target in a sectional side view, according to a further design embodiment, wherein a damping element (4 d') is disposed radially adjacent to a portion of the connector piece (6 d); in this case the damping element is at least in part disposed on a radially inboard face of the connector piece (6 d), and only the axially inboard end region of the damping element is disposed between the connector piece (6 d) and the target body (2 d); the axially inboard end region of the damping element (4 d') in this embodiment extends radially across at least a part-region of the connector piece (6 d).

DESCRIPTION OF THE INVENTION

FIGS. 1 to 4-2 show in each case schematic illustrations of an end of a tube target (1 a-d) in a sectional side view, according to various design embodiments; the tube targets (1 a-d) described may be symmetrically constructed, for example; such that the described elements of the illustrated end of the tube target (1 a-d) correspond to the elements at the opposite end (not illustrated) of the tube target (1 a-d); alternatively, the ends of the described tube targets may have ends of dissimilar designs.

For example, a first end of the target (1 a-d) may be configured as is illustrated in one of the figures, and a second end of the target (1 a-d) may have a shape deviating therefrom, such as the shape of a cap, for example. Furthermore alternatively, a first end of a tube target (1 a-d) may be configured according to one of the design embodiments illustrated in FIGS. 1 to 4-2, and a second end of the tube target (1 a-d) may be configured according to another of the design embodiments illustrated in FIGS. 1 to 4-2.

Both ends of the tube target are preferably symmetrically constructed.

Alternatively, one end is configured as is illustrated in one of FIGS. 1 to 4-2, and the other end is provided with a cap.

Figure 1:
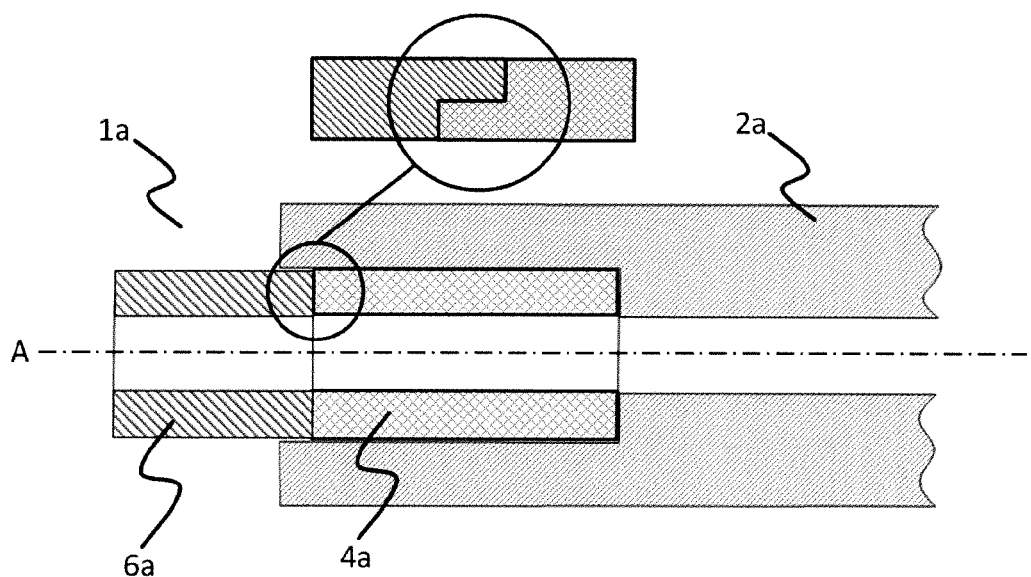
FIG. 1 shows a schematic illustration of an end of a tube target in a sectional side view, according to a first design embodiment, wherein the connector piece (6a) and the damping element (4a) are disposed so as to be axially adjacent.
Figures 1, 2:
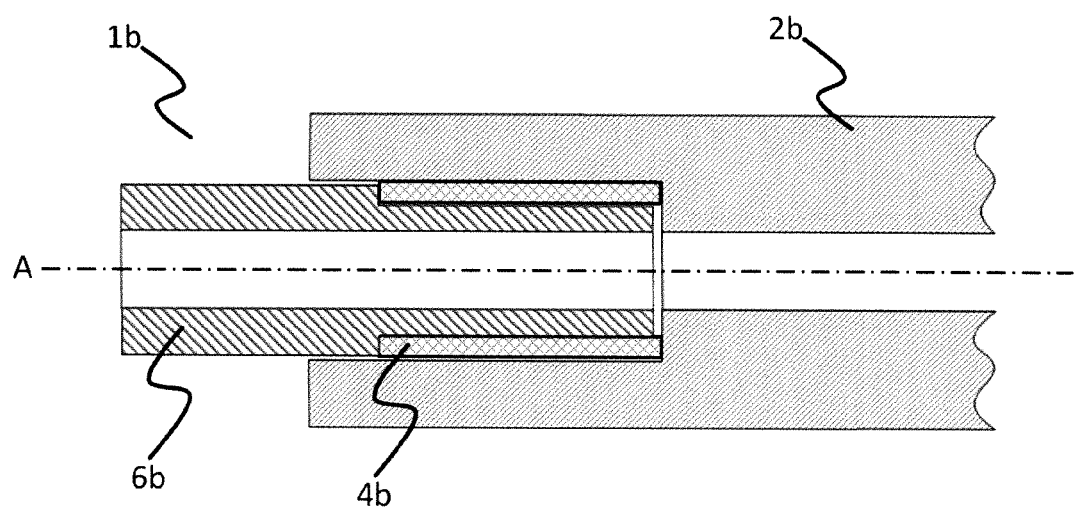
Figure 2:
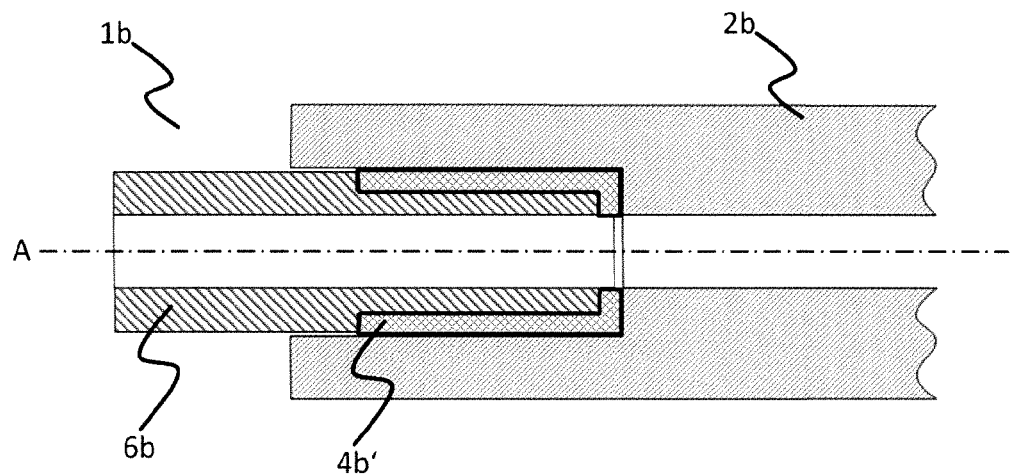
Figure 3:
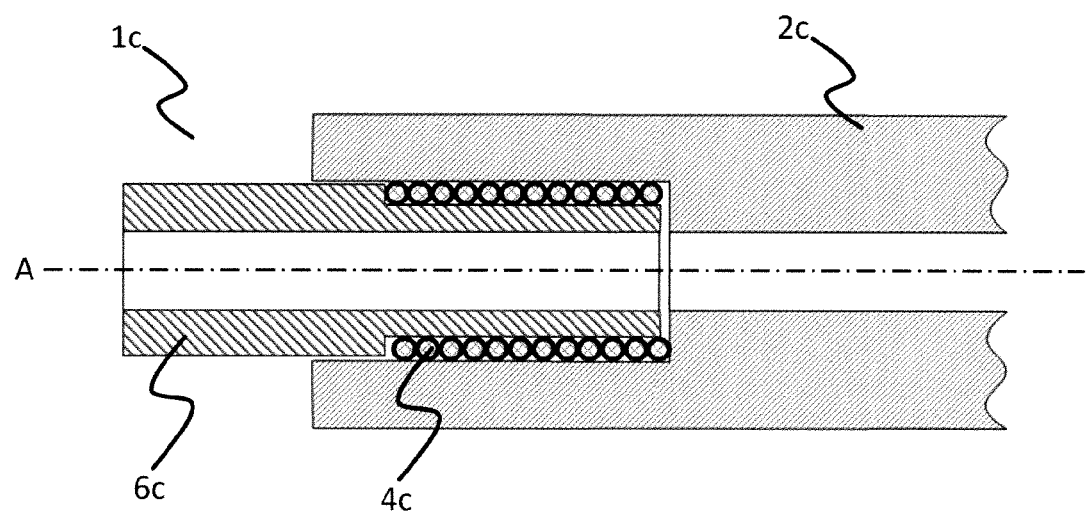
FIG. 3 shows a schematic illustration of an end of a tube target in a sectional side view, according to a further design embodiment, wherein a damping element (4 c) is disposed radially adjacent to a portion of the connector piece (6 c); the damping element, when viewed in the tangential direction, has a cross section which contains a plurality of circular cross sections.

The effect of the damping element is particularly pronounced in one of the embodiments shown in FIG. 2-1, 2-2, or 3.

Elements and properties which are common to the various design embodiments of the tube target (1 a-d) illustrated in FIGS. 1 to 4-2 will be first described hereunder.

The tube targets (1 a-d) may be used in cathode sputtering installations such as magnetron sputtering installations, for example. The susceptibility to fracturing of a target and thus the service life thereof may be improved by the tube target (1 a-d) according to the invention.

Crack formation may arise in the material of the target body, of the connector piece, or else of the optionally present adhesive or solder on account of the rotational stress of the target, the target in consequence having to be prematurely replaced. This crack formation may be reduced by means of the schematically illustrated tube target (1 a-d) such that the life span may be significantly extended.

The illustrated targets (1 a-d) are so-called monolithic targets, that is to say that the target bodies (2 a-d) are manufactured completely from the sputtering material. Said target bodies (2 a-d) in particular do not have a (continuous) support tube onto which the sputtering material is soldered/brazed, for example ("bonded targets").

Each of the illustrated targets (1 a-d) has at least one connector piece (6 a-d) which protrudes from the target body (2 a-d) and serves for connecting the target body to a cathode sputtering installation. The target body is connected to this connector piece in a vacuum-tight manner. The target body (2 a-d) and the connector piece (6 a-d) are connected in a vacuum-tight manner by means of adhesive bonding or soldering/brazing, for example; one or a plurality of annular seals or O-rings may furthermore be optionally disposed between the two elements.

The internal diameter of the at least one connector piece (6 a-c) preferably corresponds to the internal diameter of the target body (2 a-c) such that a flat or stepless transition, respectively, is provided between the two elements. In the case of the embodiment which is illustrated in FIG. 4-1 the internal diameter of the connector piece (6 d) in the region of the damping element (4 d) does not correspond to the internal diameter of the target body (2 d), but the radial extent of the damping element (4 d) is adapted in such a manner that the internal diameter of the damping element (4 d) corresponds to that of the target body (2 d).

Each of the targets (1 a-d) illustrated thus furthermore has at least one damping element (4 a-d'). This damping element is disposed between the target body (2 a-d) and the connector piece (6 a-d).

Figures 1, 4:
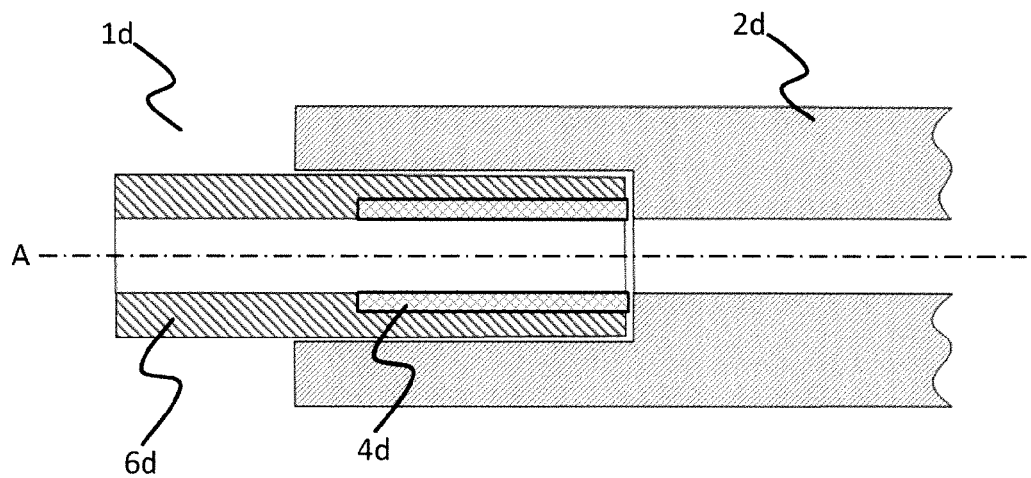
Figures 2, 4:
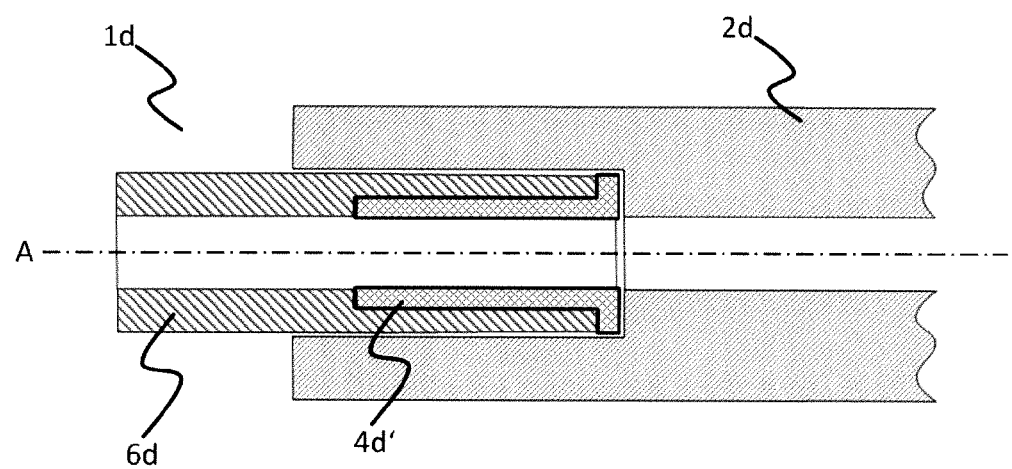

In the embodiments which are illustrated in FIGS. 1 to 4-2, the at least one damping element (4 a-d') is disposed in an advantageous manner between the target body (2 a-d) and the at least one connector piece (6 a-d) such that said damping element is connected to at least each one face of the target body (2 a-d) and to at least one face of the at least one connector piece (6 a-d). In the case of the embodiments which are illustrated in FIGS. 4-1 and 4-2, the damping element is at least in part disposed on a radially inboard face of the connector piece (6 d), and only the axially inboard end region of the damping element (4 d and 4 d') is disposed between the connector piece (6 d) and the target body (2 d). As is shown in FIG. 4-2, the axially inboard end region of the damping element (4 d') may extend radially across at least a part-region of the connector piece (6 d).

The target body (2 a-d) and the connector piece (6 a-d) may be interconnected in a materially integral manner. A solder or an adhesive may be additionally disposed between the target body (2 a-d) and the damping element (4 a-d'), and/or between the connector piece (6 a-d) and the damping element (4 a-d').

The individual elements (and the points of difference thereof) will be described in more detail hereunder with reference to the various design embodiments of the tube target (1 a-d) illustrated in the figures.

FIG. 1 shows a first design embodiment of a tube target (1 a) which has reduced susceptibility to fracturing. As is schematically illustrated, the tube target (1 a) has a connector piece (6 a) which in part protrudes from the target body (2 a). The tube target (1 a) furthermore has a damping element (4 a) which in the embodiment illustrated is disposed axially adjacent to the connector piece, specifically on that side of the connector piece that faces away from the illustrated end of the tube target.

The connection between the connector piece (6 a) and the damping element (4 a) in this case may be implemented by welding or friction welding, for example.

FIG. 2-1 shows a second design embodiment of a tube target (1 b). If no reference is made to the contrary, the elements and features of the tube target (1 a) which have been described above with reference to FIG. 1 may also be applied to the tube target (1 b) illustrated in FIG. 2-1.

In contrast to the first design embodiment according to FIG. 1, FIG. 2-1 shows a tube target (1 b) having a target body (2 b) and at least one connector piece (6 b) as well as a damping element (4 *b*) which in the radial direction between connector piece (6 *b*) and target body (2 *b*), that is to say when viewed from the axis A in a radially outward manner, is disposed adjacent to the at least one connector piece (6 *b*). The damping element (4 *b*) also in this embodiment is embodied such that the former is connected to each one face of the connector piece (6 *b*) (in this case an external face) and one face of the target body (2 *b*) (in this case an internal face).

FIG. 2-2 differs from FIG. 2-1 in that the axially inboard end region of the damping element (4 *b'*) in this embodiment extends radially across at least a part-region of the connector piece (6 *b*).

FIG. 3 shows a third design embodiment of a tube target (1 *c*). If no reference is made to the contrary, the elements and features of the tube targets (1 *a-b*) which have been described above with reference to FIGS. 1, 2-1, and 2-2 may also be applied to the tube target (1 *c*) illustrated in FIG. 3.

The three-dimensional arrangement of the embodiment shown in FIG. 3 corresponds to that of the tube target (1 *b*) shown in FIG. 2-1. In contrast to the tube target (1 *b*) described with reference to FIG. 2-1 the tube target (1 *c*) however has a damping element (4 *c*) which when viewed in the tangential direction has a cross section which contains a plurality of circular cross sections.

Such a cross section may be achieved, for example, in that the damping element (4 *c*) has the three-dimensional shape of a spring, or else is constructed from one or a plurality of annular elements having a circular cross section, respectively.

Alternatively (and not shown in the figures), a damping element according to the invention, also when viewed in the tangential direction, may have a differently configured cross section, such as one or a plurality of oval cross sections, for example, or else a cross section containing one or more square or rectangular cross sections.

FIG. 4 shows a tube target (1 *d*) having a target body (2 *d*) and a connector piece (6 *d*) which likewise has a damping element (4 *d*).

In contrast to the embodiments of the invention illustrated in FIGS. 1 to 3, the damping element (4 *d*) is at least in part disposed on an inboard face of the connector piece (6 *d*) and disposed between the connector piece (6 *d*) and the target body (2 *d*) only in the inboard end region of the damping element (4 *d*). The effect of the damping element in this case is present in a targeted manner only in the inboard end region of the damping element.

FIG. 4-2 differs from FIG. 4-1 in that the axially inboard end region of the damping element (4 *d'*) in this embodiment extends radially across at least a part-region of the connector piece (6 *d*).

In preferred embodiments of the invention the at least on damping element (4 *b-c*) is disposed on an external face of the at least one connector piece (6 *b-c*).

LIST OF REFERENCE SIGNS

1 *a-d* Tube target
2 *a-d* Target body
4 *a-d* Damping element
6 *a-d* Connector piece
A Axis of tube target

The invention claimed is:

1. A target for a cathode sputtering installation, the target comprising:
    a tubular target body formed of a sputtering material;
    at least one connector piece connected to said target body in a materially integral manner and protruding from said target body for connecting said target body to the cathode sputtering installation;
    said target body being connected to said at least one connector piece in a vacuum-tight manner and so as to be secured against twisting; and
    at least one damping element disposed between said at least one connector piece and said target body.

2. The target according to claim 1, wherein said at least one damping element is disposed between said target body and said at least one connector piece with said damping element being connected to each at least one surface of said target body and to at least one surface of said at least one connector piece.

3. The target according to claim 1, wherein at least one connection selected from the group consisting of said target body and said connector piece, said target body and said damping element, and said connector piece and said damping element is a materially integral connection.

4. The target according to claim 1, which comprises solder or adhesive disposed between at least one of said target body and said damping element or said connector piece and said damping element.

5. The target according to claim 1, wherein a thickness of said damping element in a radial direction lies between 0.25 and 5 mm.

6. The target according to claim 1, wherein said damping element has a coefficient of thermal expansion lying between a coefficient of thermal expansion of said target body and a coefficient of thermal expansion of said at least one connector piece.

7. The target according to claim 1, wherein said target body is composed of a material selected from the group consisting of molybdenum, a molybdenum-based alloy, titanium, a titanium-based alloy, copper and a copper alloy.

8. The target according to claim 1, wherein said connector piece and said damping element are disposed axially adjacent one another.

9. The target according to claim 1, wherein said at least one damping element is disposed radially adjacent at least one portion of said at least one connector piece.

10. The target according to claim 9, wherein said at least one damping element is disposed on an external face of said at least one connector piece.

* * * * *